United States Patent
Zhou (10) Patent No.: US 10,460,996 B2
(45) Date of Patent: Oct. 29, 2019

(54) FIN FIELD EFFECT TRANSISTOR AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/912,218

(22) Filed: Mar. 5, 2018

(65) Prior Publication Data
US 2018/0261508 A1  Sep. 13, 2018

(30) Foreign Application Priority Data
Mar. 7, 2017 (CN) .......................... 2017 1 0130767

(51) Int. Cl.
*H01L 21/8234* (2006.01)
*H01L 29/66* (2006.01)
(Continued)

(52) U.S. Cl.
CPC .. *H01L 21/823462* (2013.01); *H01L 21/0214* (2013.01); *H01L 21/02164* (2013.01); *H01L 21/02236* (2013.01); *H01L 21/31116* (2013.01); *H01L 21/324* (2013.01); *H01L 21/823431* (2013.01); *H01L 27/0886* (2013.01);
(Continued)

(58) Field of Classification Search
CPC ............ H01L 21/31116; H01L 29/165; H01L 21/02164; H01L 21/022; H01L 29/66545; H01L 21/0228; H01L 21/0214; H01L 29/4966; H01L 29/513; H01L 27/0886; H01L 21/02236; H01L 21/02192; H01L 21/02238; H01L 29/7848; H01L 21/32139; H01L 29/4232; H01L 21/308; H01L 21/823462; H01L 21/823431; H01L 21/324; H01L 29/517
See application file for complete search history.

(56) References Cited

U.S. PATENT DOCUMENTS 8,497,171 B1 * 7/2013 Wu ................. H01L 21/823821
438/199

* cited by examiner

*Primary Examiner* — Jasmine J Clark
(74) *Attorney, Agent, or Firm* — Anova Law Group, PLLC (57) ABSTRACT

A fin field effect transistor (FinFET) and a method for fabricating the FinFET are provided. The method includes providing a plurality of discrete fins on a semiconductor substrate, and forming a dummy gate across a length portion of the fins and covering portions of top and sidewall surfaces of the fins. The method also includes forming an interlayer dielectric layer, covering the dummy gate and the fins, and forming an opening in the interlayer dielectric layer. In addition, the method includes forming a gate dielectric layer in the opening and on the interlayer dielectric layer, and forming a barrier layer on the gate dielectric layer. Moreover, the method includes removing the gate dielectric layer and the barrier layer from the interlayer dielectric layer, and performing an annealing treatment. Further, the method includes removing the barrier layer in the opening, and forming a metal gate in the opening.

20 Claims, 9 Drawing Sheets

(51) Int. Cl.
  *H01L 21/311*     (2006.01)
  *H01L 29/51*      (2006.01)
  *H01L 21/02*      (2006.01)
  *H01L 21/324*     (2006.01)
  *H01L 27/088*     (2006.01)
  *H01L 21/3213*    (2006.01)
  *H01L 29/49*      (2006.01)
  *H01L 29/78*      (2006.01)
  *H01L 29/165*     (2006.01)

(52) U.S. Cl.
  CPC .......... *H01L 29/513* (2013.01); *H01L 29/517* (2013.01); *H01L 29/66545* (2013.01); *H01L 21/022* (2013.01); *H01L 21/0228* (2013.01); *H01L 21/02181* (2013.01); *H01L 21/02192* (2013.01); *H01L 21/02194* (2013.01); *H01L 21/02238* (2013.01); *H01L 21/31122* (2013.01); *H01L 21/31138* (2013.01); *H01L 21/31144* (2013.01); *H01L 21/32134* (2013.01); *H01L 21/32135* (2013.01); *H01L 21/32139* (2013.01); *H01L 29/165* (2013.01); *H01L 29/4966* (2013.01); *H01L 29/7848* (2013.01)

Figure 17

FIN FIELD EFFECT TRANSISTOR AND FABRICATION METHOD THEREOF

CROSS-REFERENCES TO RELATED APPLICATIONS

This application claims the priority of Chinese patent application No. 201710130767.X, filed on Mar. 7, 2017, the entirety of which is incorporated herein by reference.

FIELD OF THE DISCLOSURE

The present disclosure generally relates to the field of semiconductor manufacturing technology and, more particularly, relates to a fin field effect transistor and fabrication method thereof.

BACKGROUND

With the rapid development of semiconductor technology, feature dimensions of semiconductor devices continue to decrease. The reduction of the feature dimensions of the semiconductor devices requires highly on performance of the semiconductor devices.

Currently, size of a metal-oxide semiconductor field-effect transistor (MOSFET) continues to become smaller. To meet reduction of the process node, a channel length of the MOSFET is gradually shortened. The reduction of the channel length has many advantages, such as increasing die density of a chip, and increasing switching speed of the MOSFET, etc.

However, the reduction of the channel length easily causes the control ability of a gate on the channel to become weakened, and it is more difficult to pinch off the channel by a gate voltage. As a result, a subthreshold leakage phenomenon, also known as a short-channel effect (SCE), is more likely to occur.

Therefore, to better meet requirements of scaling down the device size, the semiconductor process is gradually transitioning from the planar MOSFET to a three-dimensional transistor having higher-efficiency, such as a fin field effect transistor (FinFET). The FinFET has desired gate-to-channel control ability, and the short channel effect can be reduced.

However, a leakage phenomenon easily occurs when the FinFET is in operation, and the electrical performance of the FinFET is affected. How to improve the electrical performance of the FinFET has become an urgent issue to be solved. The disclosed device structures and methods are directed to solve one or more problems set forth above and other problems.

BRIEF SUMMARY OF THE DISCLOSURE

One aspect of the present disclosure includes a method for fabricating a fin field effect transistor (FinFET). The method includes providing a plurality of discrete fins on a semiconductor substrate, and forming a dummy gate across a length portion of the fins and covering portions of top and sidewall surfaces of the fins. The method also includes forming an interlayer dielectric layer, covering the dummy gate and the fins, and forming an opening in the interlayer dielectric layer by removing the dummy gate. In addition, the method includes forming a gate dielectric layer in the opening and on the interlayer dielectric layer, and forming a barrier layer on the gate dielectric layer. Moreover, the method includes removing the gate dielectric layer and the barrier layer from the interlayer dielectric layer, and performing an annealing treatment after removing the gate dielectric layer and the barrier layer from the interlayer dielectric layer. Further, the method includes removing the barrier layer in the opening, and forming a metal gate in the opening.

Another aspect of the present disclosure includes a fin field effect transistor (FinFET) formed by the disclosed method. The FinFET includes a semiconductor substrate, and a plurality of discrete fins on the semiconductor substrate. The FinFET also includes an interlayer dielectric layer on the semiconductor substrate and the fins, and a gate dielectric layer on the fins. The interlayer dielectric layer contains an opening, In addition, the FinFET includes a barrier layer on the gate dielectric layer. The barrier layer is made of a material including silicon. Moreover, the FinFET includes a metal gate on the barrier layer, and an opening in the interlayer dielectric layer. The barrier layer surrounds the opening. Further, the FinFET includes source and drain doped regions in the fins.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
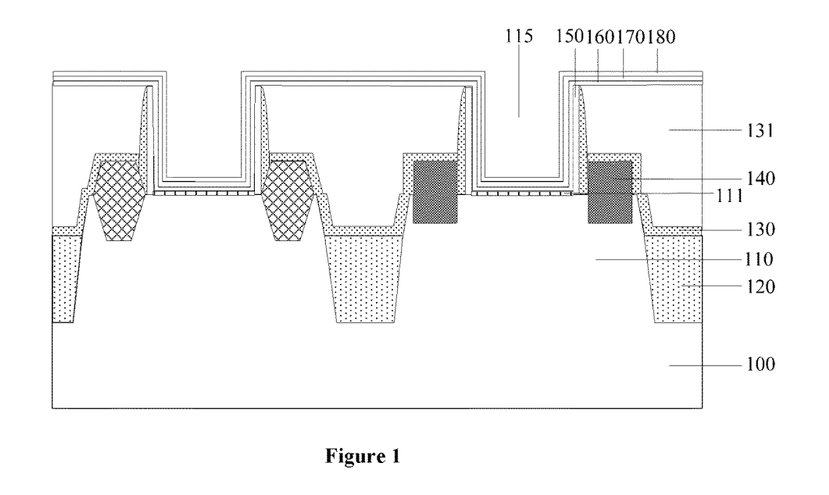
FIG. 1 illustrates a semiconductor structure corresponding to certain stage for forming a FinFET.

FIG. 1 illustrates a semiconductor structure corresponding to certain stage for forming a FinFET. Referring to FIG. 1, a plurality of fins 110 are formed on the substrate 100. An isolation structure 120 is formed on the substrate 100 between the adjacent fins 110. The isolation structure 120 covers portions of sidewall surfaces of the fins 110, and a top surface of the isolation structure 120 is lower than top surfaces of the fins 110. A dummy gate (not illustrated) across a length portion of the fins 110 and covering portions of top and sidewalls of the fins 110 is formed. A sidewall spacer 150 is formed on sidewalls of the dummy gate. Source and drain doped regions 140 are formed in the fins 110 on both sides of the dummy gate. An etching stop layer 130 is formed to cover the source and drain doped regions 140 and the dummy gate. An interlayer dielectric layer 131 is formed to cover the dummy gate and the fins 110. The dummy gate is removed to form an opening 115 in the interlayer dielectric layer 131. An interface dielectric layer 111 is formed in the opening 115, and a gate dielectric layer 160 is formed on the interface dielectric layer 111 and the interlayer dielectric layer 131. A working function layer 170 is formed on the gate dielectric layer 160, and a barrier layer 180 is formed on the working function layer 170. An annealing treatment is performed after forming the barrier layer 180, and a metal gate (not illustrated) is formed by filling the opening 115 with a metal material.

Because a high temperature may be used during the annealing treatment, such that stress may be generated in the barrier layer 180, which may cause stress deformation of the interface dielectric layer 111 on the fins 110. A leakage phenomenon may then occur to degrade electrical performance of the formed FinFET.

In addition, the barrier layer 180 may easily expand upon heating during the annealing treatment. Because thermal expansion coefficients of the barrier layer 180 and the gate dielectric layer 160 are different, the barrier layer 180 and the gate dielectric layer 160 may interact to generate a stress during the heating process, and stress deformation may be generated in the interface dielectric layer 111 in contact with the gate dielectric layer 160, resulting in the occurrence of the leakage phenomenon.

Figure 17:
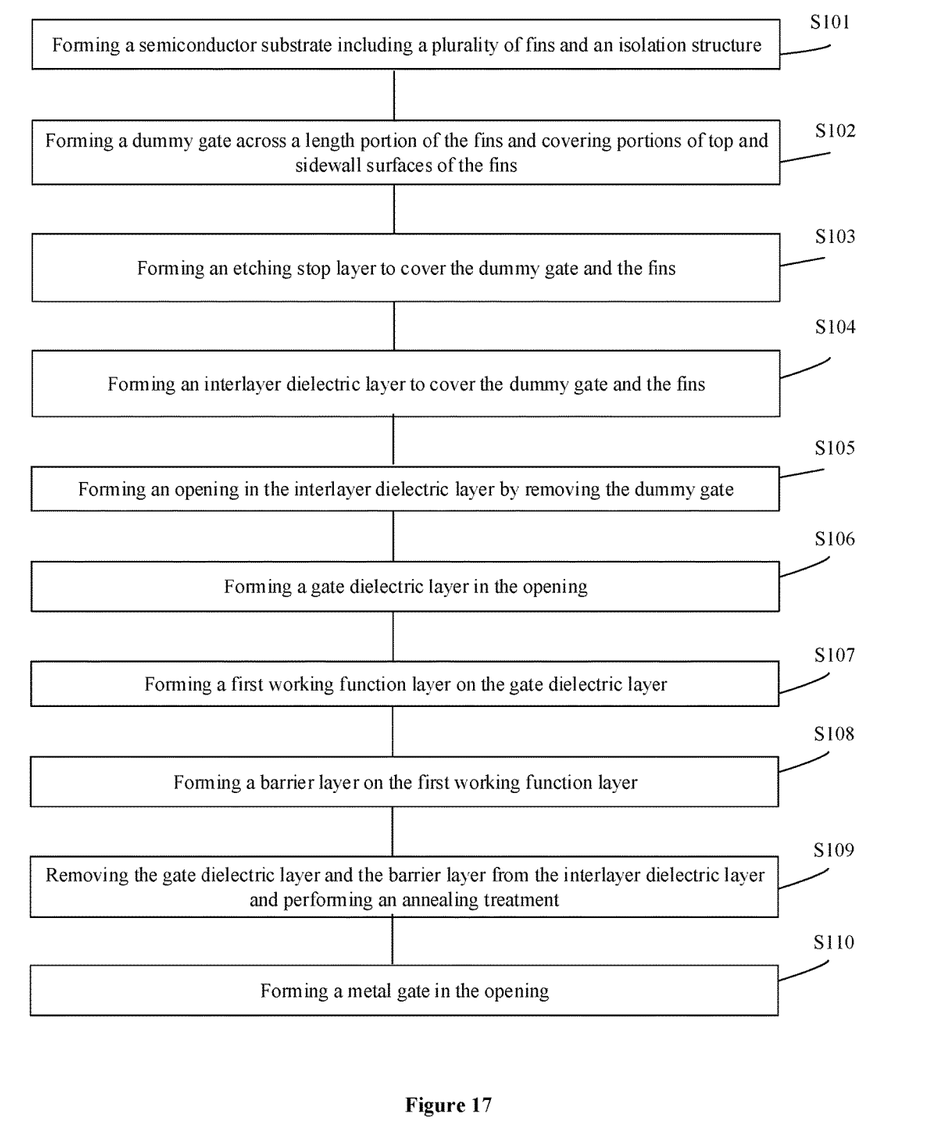
FIG. 17 illustrates an exemplary fabrication method for forming a FinFET consistent with various disclosed embodiments of the present disclosure.

The present disclosure provides a FinFET and fabrication method thereof. FIG. 17 illustrates an exemplary fabrication method to form a FinFET consistent with the disclosed embodiments; and FIGS. 2-15 illustrate semiconductor structures corresponding to certain stages of the exemplary fabrication process.

Figure 2:
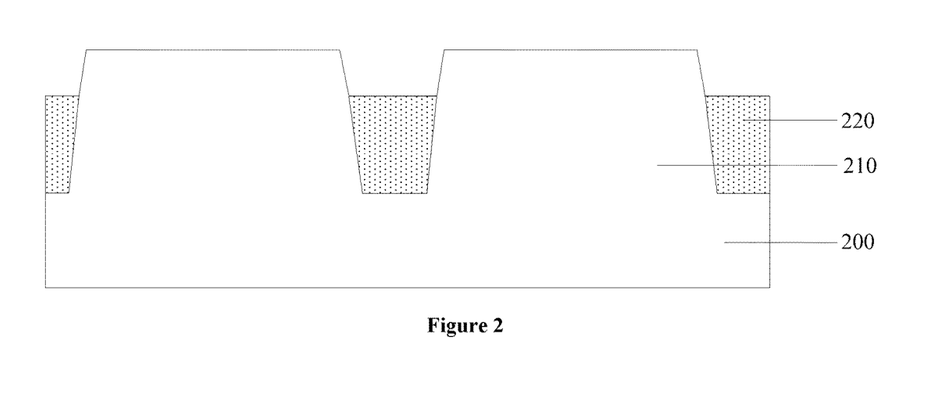
FIGS. 2-15 illustrate semiconductor structures corresponding to certain stages of an exemplary fabrication method for forming a FinFET consistent with various disclosed embodiments of the present disclosure.

As shown in FIG. 17, at the beginning of the fabrication process, a semiconductor substrate with certain structures may be formed (S101). FIG. 2 illustrates a corresponding semiconductor structure.

Referring to FIG. 2, a semiconductor substrate 200 may be provided. A plurality of discrete fins 210 may be formed on the semiconductor substrate 200. In one embodiment, an isolation structure 220 may be formed on the semiconductor substrate 200 between the adjacent fins 210. The isolation structure 220 may cover portions of sidewall surfaces of the fins 210, and the top of the isolation structure 220 may be lower than the top of the fins 210. The isolation structure 220 may be used to electrically isolate the adjacent fins.

In one embodiment, the semiconductor substrate 200 may include a silicon substrate. In certain embodiments, the semiconductor substrate 200 may be made of silicon (Si), germanium (Ge), germanium-silicon alloy (GeSi), silicon carbide (SiC), gallium arsenide (GaAs), or indium gallium (InGa), etc. The semiconductor substrate 200 may also include a silicon substrate formed on insulator (SOI), or a germanium substrate formed on insulator (GOI), etc.

In one embodiment, the fins 210 may be made of silicon. In certain embodiments, the fins 210 may be made of silicon (Si), germanium (Ge), germanium-silicon alloy (GeSi), silicon carbide (SiC), gallium arsenide (GaAs), or indium gallium (InGa), etc.

In one embodiment, the isolation structure 220 may be made of silicon oxide. In certain embodiments, the isolation structure 220 may be made of silicon nitride, silicon oxynitride, or silicon carbonitride oxide, etc.

In one embodiment, the method for forming the semiconductor substrate 200 and the fins 210 may include: providing an initial substrate; forming a patterned hard mask layer on the initial substrate; and etching the initial substrate by using the hard mask layer as a mask. The etched initial substrate may be used as the semiconductor substrate 200, and protrusions on the semiconductor substrate 200 may be used as the fins 210. In one embodiment, the hard mask layer on the top of the fins 210 may be retained.

In one embodiment, the method for forming the patterned hard mask layer may include: forming an initial hard mask layer; forming a patterned photoresist layer on the initial hard mask layer; etching the initial hard mask layer by using the patterned photoresist layer as a mask to form the hard mask layer on the initial substrate; and removing the patterned photoresist layer. In certain embodiments, the method for forming the hard mask layer may also include a self-aligned double patterned (SaDP) process, a self-aligned triple patterned (SaTP) process, or a self-aligned double double patterned (SaDDP) process, etc. The double patterned process may include a litho-etch-litho-etch (LELE) process, or a litho-litho-etch (LLE) process, etc.

In one embodiment, the method for forming the isolation structure 220 may include: forming an isolation film on the semiconductor substrate 200 to cover the fins 210, where the top of the isolation film is above the top of the fins 210; performing a planarization process on the top of the isolation film; and back-etching portions of thickness of the isolation film after performing the planarization process to form the isolation structure 220 on the semiconductor substrate 200. The hard mask layer on the top of the fins 210 may be removed while back-etching portions of thickness of the isolation film.

Figure 3:
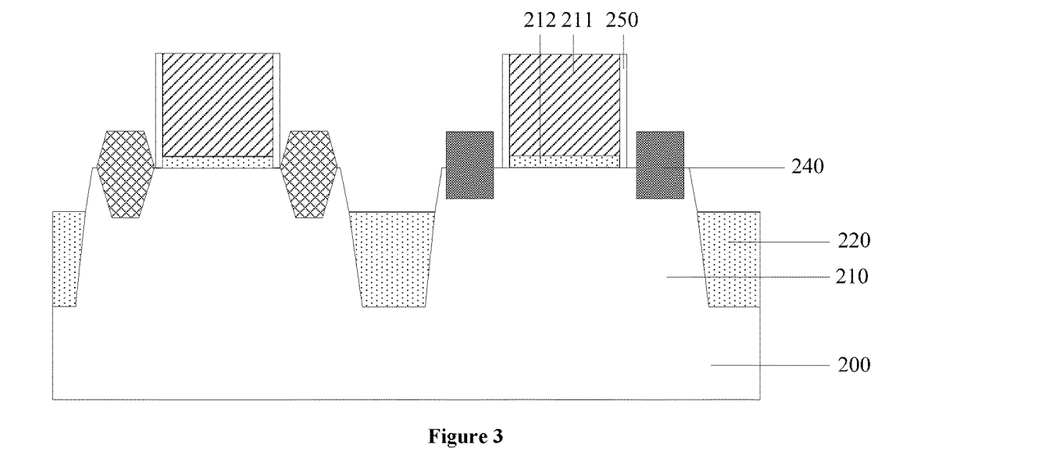

Returning to FIG. 17, after forming the semiconductor substrate having the fins and the isolation structure, a dummy gate may be formed (S102). FIG. 3 illustrates a corresponding semiconductor structure.

Referring to FIG. 3, a dummy gate 211 may be formed on the fins 210. The dummy gate 211 may be across a length portion of the fins 210, and cover portions of top and sidewalls of the fins 210. The method for forming the dummy gate 211 may include: forming a gate layer to cover the semiconductor substrate 200 and the fins 210; forming a hard mask layer on the gate layer, where the hard mask layer may define the pattern of the dummy gate 211 to be formed; etching the gate layer by using the hard mask layer as a mask to form the dummy gate 211 across a length portion of the fins; and removing the hard mask layer on top of the dummy gate 211 after forming the dummy gate 211. In one embodiment, the dummy gate 211 may be made of polysilicon.

In one embodiment, before forming the dummy gate 211, a dummy gate dielectric layer 212 may be formed on the semiconductor substrate 200. The dummy gate dielectric layer 212 may be made of a high-K gate dielectric material.

In one embodiment, after forming the dummy gate 211 and before subsequently forming an interlayer dielectric layer, the method may also include: forming a sidewall spacer 250 on sidewalls of the dummy gate 211; and forming source and drain doped regions 240 in the fins 210 on both sides of the dummy gate 211 and the sidewall spacer 250. The source and drain doped regions 240 may be doped with P-type ions, or N-type ions.

The method for forming the source and drain doped regions 240 may include: etching the fins 210 on both sides of the dummy gate 211 to form trenches in the fins 210 on both sides of the dummy gate 211; and forming the source and drain doped regions 240 to sufficiently fill the trenches. The source and drain doped regions 240 may be doped with P-type ions, or N-type ions.

In one embodiment, the source and drain doped regions 240 may be formed by a selective epitaxial process. When the formed FinFET is an NMOS device, the source and drain doped regions 240 may be made of Si, or SiC. When the source and drain doped regions 240 are made of SiC, the source and drain doped regions 240 may provide a tensile stress to the channel region to increase the carrier mobility of the NMOS device. The source and drain doped regions 240 may be doped with N-type ions. For example, the N-type ions may include P, As, or Sb, etc.

When the formed FinFET is a PMOS device, the source and drain doped regions 240 may be made of Si, or SiGe. The source and drain doped regions 240 may be doped with P-type ions. For example, the P-type ions may include B, Ga, or In, etc. When the source and drain doped regions 240 are made of SiGe, the source and drain doped regions 240 may provide a compressive stress to the channel region to increase the carrier mobility of the PMOS device.

Figure 4:
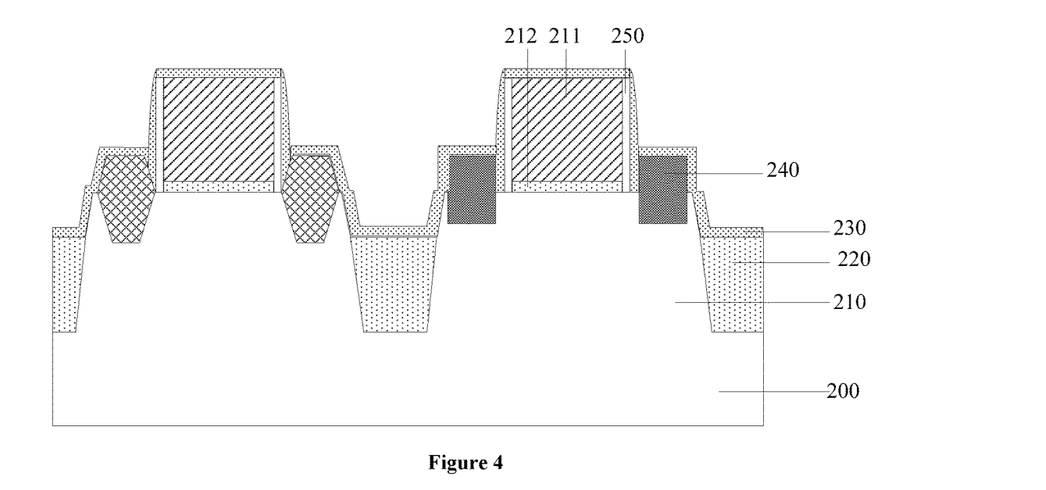

Returning to FIG. 17, after forming the dummy gate, an etching stop layer may be formed (S103). FIG. 4 illustrates a corresponding semiconductor structure.

Referring to FIG. 4, an etching stop layer 230 may be formed to cover the dummy gate 211 and the fins 210. In one embodiment, the etching stop layer 230 may be used as a stop layer for forming a contact hole by etching in a subsequent process for forming the contact hole of the FinFET. The etching stop layer 230 may be made of silicon nitride. A thickness of the etching stop layer 230 may be in a range of approximately 5 nm-30 nm.

Figure 5:
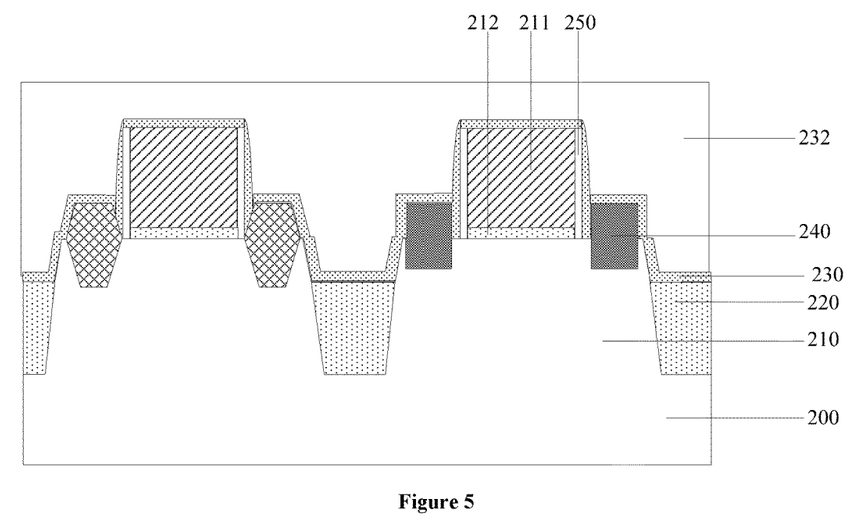
Figure 6:
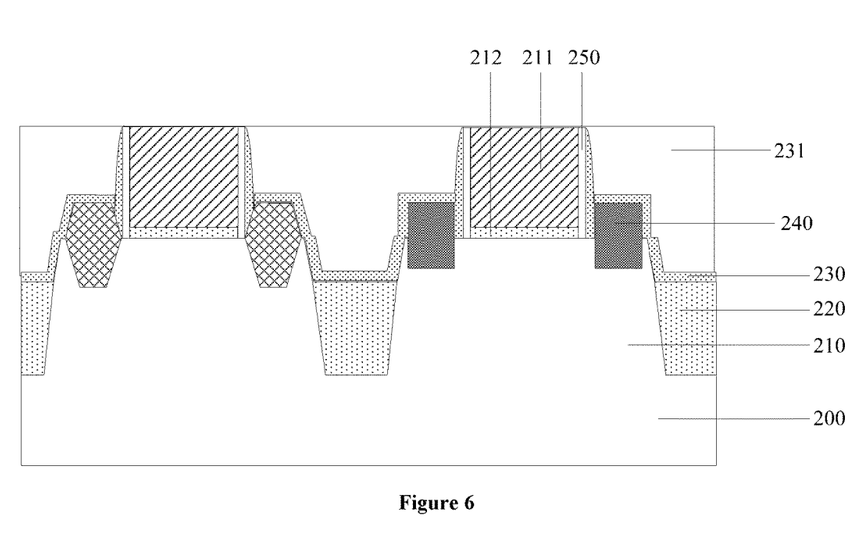

Returning to FIG. 17, after forming the etching stop layer, an interlayer dielectric layer may be formed (S104). FIGS. 5-6 illustrate corresponding semiconductor structures.

Referring to FIG. 6, an interlayer dielectric layer 231 may be formed to cover the dummy gate 211 and the fins 210. The interlayer dielectric layer 231 may expose the top of the dummy gate 211.

Referring to FIG. 5, the method for forming the interlayer dielectric layer 231 may include forming an interlayer dielectric film 232 on the etching stop layer 230. The top of the interlayer dielectric film 232 may be above the top of the dummy gate 211. In one embodiment, the interlayer dielectric film 232 may be made of silicon oxide.

Referring to FIG. 6, the method for forming the interlayer dielectric layer 231 may also include planarizing the interlayer dielectric film 232 (illustrated in FIG. 5) to form the interlayer dielectric layer 231, exposing the dummy gate 211 and covering the fins 210. In one embodiment, the top of the interlayer dielectric layer 231 may be coplanar with the top of the dummy gate 211.

In one embodiment, the etching stop layer 230 may be formed on the dummy gate 211, and the planarization process may also remove the etching stop layer 230 on the dummy gate 211.

In one embodiment, a chemical mechanical polishing process may be used to planarize the whole surface of the interlayer dielectric film 232, surface defects generated when forming the interlayer dielectric layer 231 may be reduced. At the same time, the planarization process performed on the interlayer dielectric film 232 may also remove the etching stop layer 230 on the dummy gate 211, and the process steps may be simplified.

The etching stop layer 230 may be removed by a dry etching process. Parameters of the dry etching process may include the following. Etching gas may include a mixed gas of $CH_2F_2$, $O_2$ and $CF_4$; $CH_2F_2$ gas flow rate may be in a range of approximately 8 sccm-50 sccm; $O_2$ gas flow rate may be in a range of approximately 2 sccm-30 sccm, $CF_4$ gas flow rate may be in a range of approximately 30 sccm-200 sccm, pressure may be in a range of approximately 10 mtorr-2000 mtorr, voltage may be in a range of approximately 30 V-500 V, and RF power may be in a range of approximately 100 W-1000 W.

Figure 7:
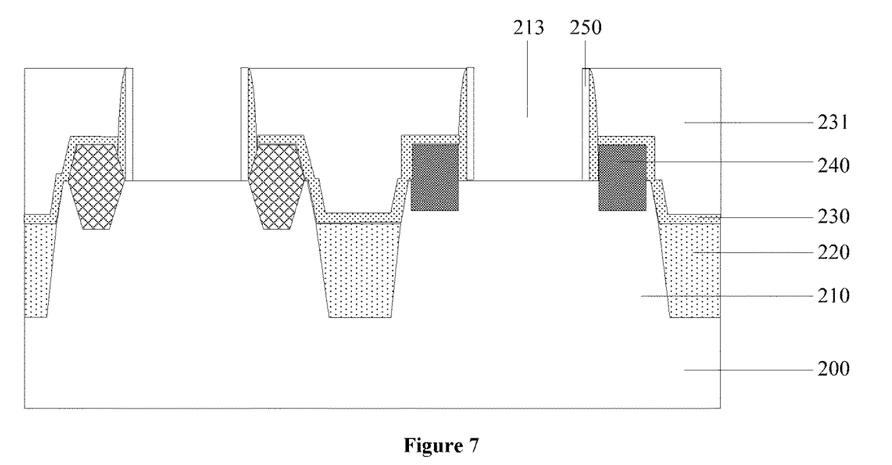

Returning to FIG. 17, after forming the interlayer dielectric layer, an opening may be formed (S105). FIG. 7 illustrates a corresponding semiconductor structure.

Referring to FIG. 7, an opening 213 may be formed in the interlayer dielectric layer 231 by removing the dummy gate 211. In one embodiment, the dummy gate dielectric layer 212 (shown in FIG. 6) on the fins 210 may also be removed while removing the dummy gate 211.

In one embodiment, the dummy gate 211 may be made of polysilicon. The process for removing the dummy gate 211 may include a dry etching process. Parameters of the dry etching process may include the following. Etching gas may include a mixed gas of HBr and He; HBr gas flow rate may be in a range of approximately 150 sccm-500 sccm; He gas flow rate may be in a range of approximately 100 sccm-400 sccm, pressure may be in a range of approximately 3 mtorr-10 mtorr, and RF power may be in a range of approximately 10 W-500 W.

Figure 8:
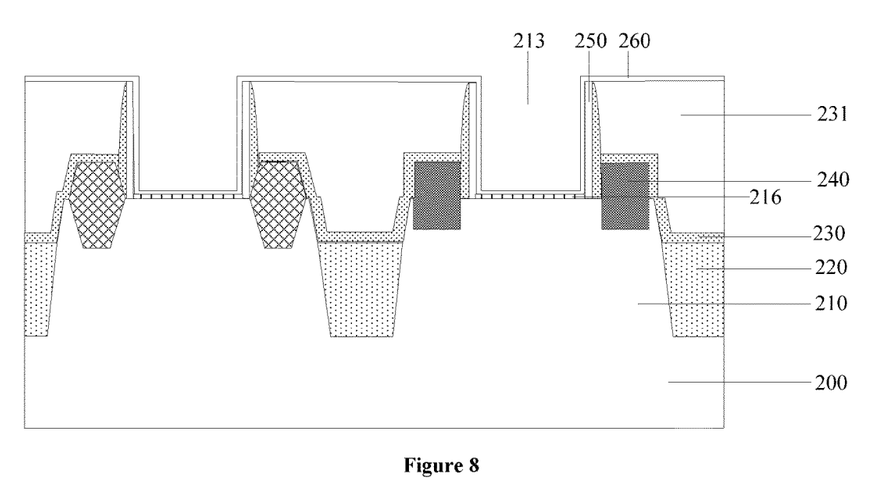

Returning to FIG. 17, after forming the opening, a gate dielectric layer may be formed (S106). FIG. 8 illustrates a corresponding semiconductor structure.

Referring to FIG. 8, a gate dielectric layer 260 may be formed in the opening 213. In one embodiment, the gate dielectric layer 260 may be made of hafnium oxide, or lanthanum hafnium oxide, etc. A thickness of the gate dielectric layer 260 may be in a range of approximately 10 Å-30 Å.

In one embodiment, the gate dielectric layer 260 may be formed by an atomic layer deposition (ALD) process. Suitable precursor(s) may be introduced into an atomic layer deposition chamber at a temperature in a range of approximately 80° C.-300° C., under a pressure in a range of approximately 5 torr-20 torr. The ALD process may be repeatedly performed, e.g., having deposition times in a range of approximately 5 times-50 times.

In one embodiment, before forming the gate dielectric layer 260, an interface dielectric layer 216 may be formed on the bottom of the opening. The gate dielectric layer 260 may be formed on the interface dielectric layer 216. The interface dielectric layer 216 is made of silicon oxide, or silicon oxynitride. A thickness of the interface dielectric layer 216 may be in a range of approximately 5 Å-10 Å.

The process for forming the interface dielectric layer 216 may include an oxidation process. Parameters of the oxidation process may include the following. Introduced gas may include $H_2O_2$ gas, and reaction time may be in a range of approximately 5 seconds-500 seconds at a temperature in a range of approximately 10° C.-100° C. In another embodiment, introduced gases may include $H_2$ and $O_2$, $H_2$ gas flow rate may be in a range of approximately 0.2 slm-10 slm, $O_2$ gas flow rate may be in a range of approximately 10 slm-100 slm, reaction temperature may be in a range of 800° C.-1100° C., pressure may be in a range of approximately 4 torr-100 torr, and time may be in a range of approximately 5 seconds-30 seconds.

Figure 9:
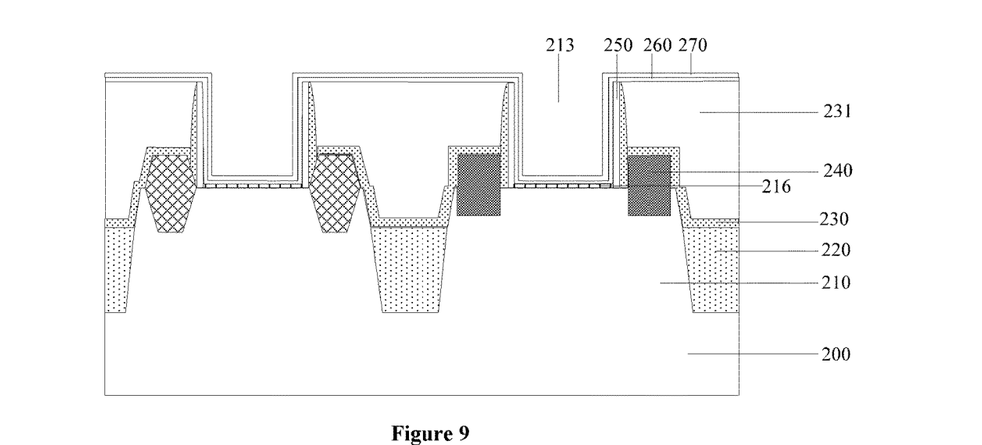

Returning to FIG. 17, after forming the gate dielectric layer, a first working function layer may be formed (S107). FIG. 9 illustrates a corresponding semiconductor structure.

Referring to FIG. 9, after forming the gate dielectric layer 260, a first working function layer 270 may be formed on the gate dielectric layer 260. The first working function layer 270 may be used to adjust threshold voltage of the FinFET. In one embodiment, the first working function layer 270 may be made of titanium nitride, or tantalum nitride, etc. A thickness of the first working function layer may be in a range of approximately 8 Å-50 Å.

In one embodiment, the process for forming the first working function layer 270 may include an atomic layer deposition process. Parameters of the atomic layer deposition process may include the following. Precursor introduced into an atomic layer deposition chamber may include Ti, temperature may be in a range of approximately 80°

C.-300° C., pressure may be in a range of approximately 5 torr-20 torr, and deposition times may be in a range of approximately 5 times-50 times.

Figure 10:
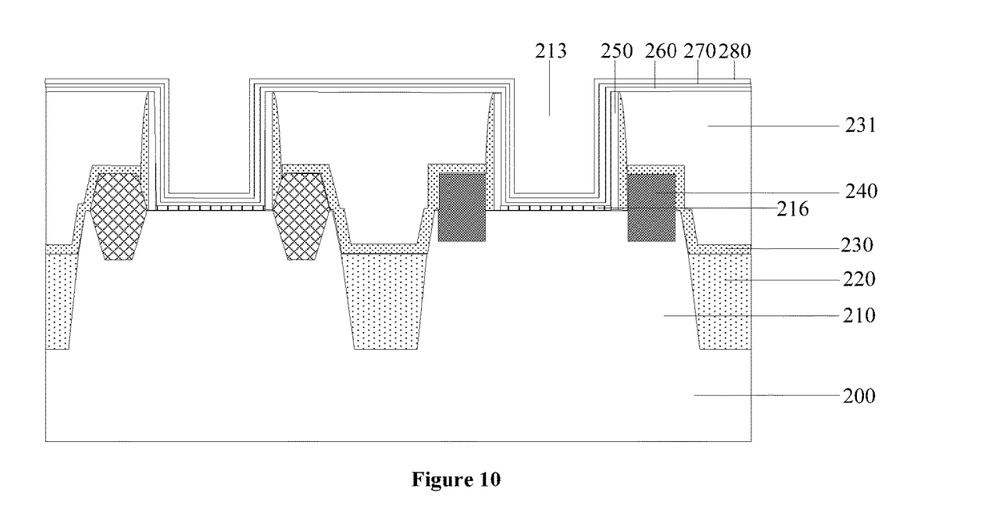

Returning to FIG. 17, after forming the first working function layer, a barrier layer may be formed (S108). FIG. 10 illustrates a corresponding semiconductor structure.

Referring to FIG. 10, a barrier layer 280 may be formed on the first working function layer 270. In one embodiment, the barrier layer 280 may be used to control or avoid the regrowth of the interface dielectric layer 216 on the fins 210.

In one embodiment, to repair defects on the interface dielectric layer 216 in contact with the fins 210 and to densify the interface dielectric layer 216, an annealing treatment may be performed in the subsequent processes after removing the gate dielectric layer 260 and the barrier layer 280 on the interlayer dielectric layer 231. Temperature of the annealing treatment may be high, and the interface dielectric layer 216 may be regrown due to the oxygen in air, therefore the electrical performance of the FinFET may be affected.

In one embodiment, the barrier layer 280 may be formed on the gate dielectric layer 260. The barrier layer 280 may block oxygen in air from entering the interface dielectric layer. The regrowth issue of the interface dielectric layer 216 occurred during the subsequent annealing treatment may be avoided.

In one embodiment, the barrier layer 280 may be made of silicon. A thickness of the barrier layer 280 cannot be too large nor too small. When the thickness of the barrier layer 280 is too large, size of the opening 213 (illustrated in FIG. 10) made by the barrier layer may tend to be too small during the annealing process. When the thickness of the barrier layer 280 is too small, the oxygen in air may penetrate through the barrier layer 280 into the interface dielectric layer 216, which causes the regrowth issue of the interface dielectric layer 216. In one embodiment, the thickness of the barrier layer 280 may be in a range of approximately 20 Å-50 Å.

The barrier layer 280 may be formed by an atomic layer deposition process, or a furnace tube deposition process, etc. Parameters of the atomic layer deposition process may include the following. Introduced gas may include $SiH_4$, temperature may be in a range of approximately 360° C.-520° C., and pressure may be in a range of approximately 0.03 torr-10 torr.

Returning to FIG. 17, after forming the barrier layer, the gate dielectric layer and the barrier layer on the interlayer dielectric layer may be removed and an annealing treatment may be performed (S109). FIGS. 11-14 illustrate corresponding semiconductor structures.

Figure 11:
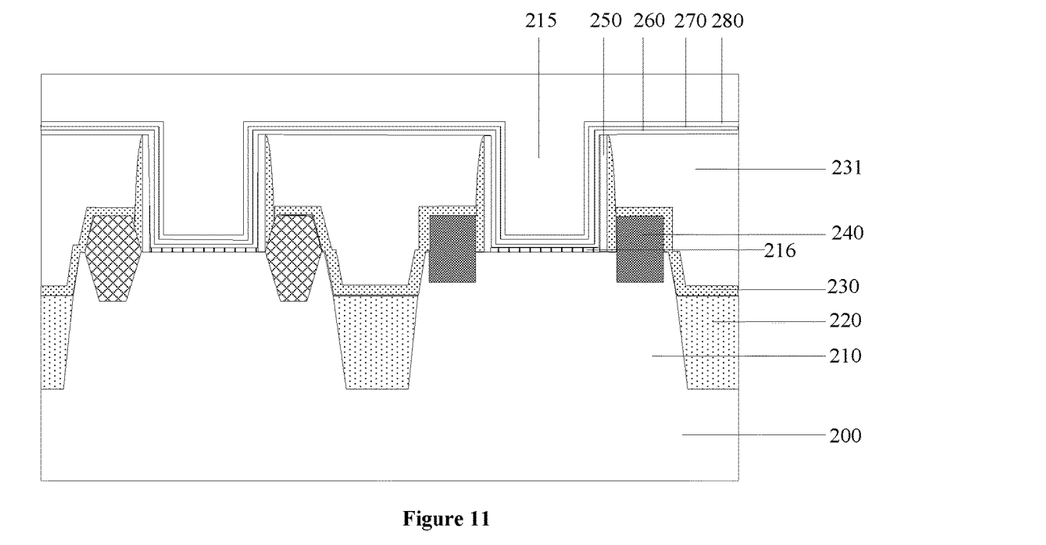

Referring to FIGS. 11-14, the gate dielectric layer 260 and the barrier layer 280 on the interlayer dielectric layer 231 may be removed. Referring to FIG. 11, the method for removing the gate dielectric layer 260 and the barrier layer 280 on the interlayer dielectric layer 231 may include forming an organic coating film 215 to cover the barrier layer 280. The organic coating film 215 may be formed by a spin coating process. Parameters of the spin coating process may include a spin speed in a range of approximately 1000 r/min-50000 r/min.

Figure 12:
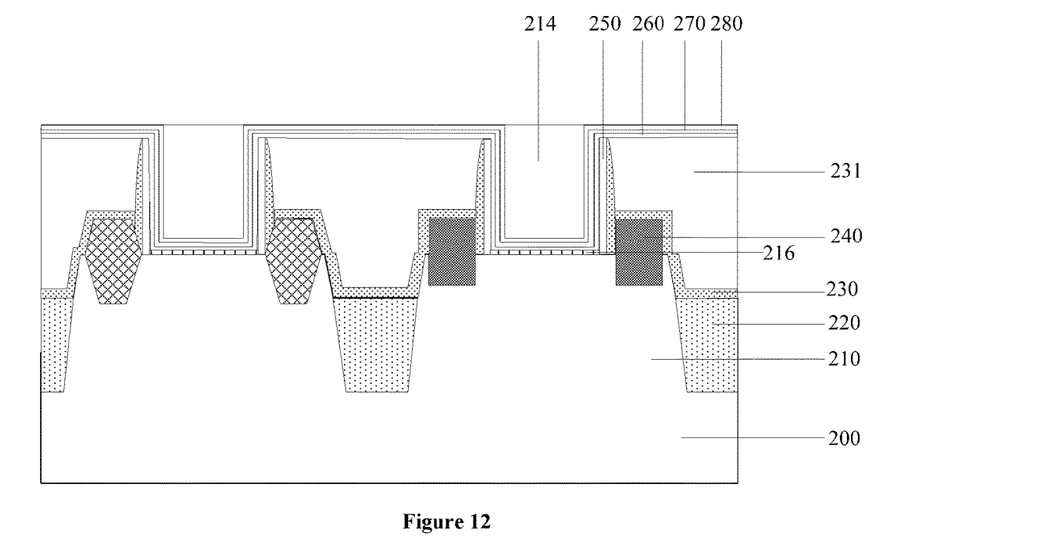

Referring to FIG. 12, the method for removing the gate dielectric layer 260 and the barrier layer 280 on the interlayer dielectric layer 231 may also include back-etching the organic coating film 215 on the interlayer dielectric layer 231 (shown in FIG. 11) to form an organic coating layer 214 in the opening 213 (shown in FIG. 10).

In one embodiment, the organic coating layer 214 may be made of an organic material. The organic coating layer 214 may be used as a mask for removing the gate dielectric layer 260 and the barrier layer 280 on the interlayer dielectric layer 231 during the subsequent processes.

Figure 13:
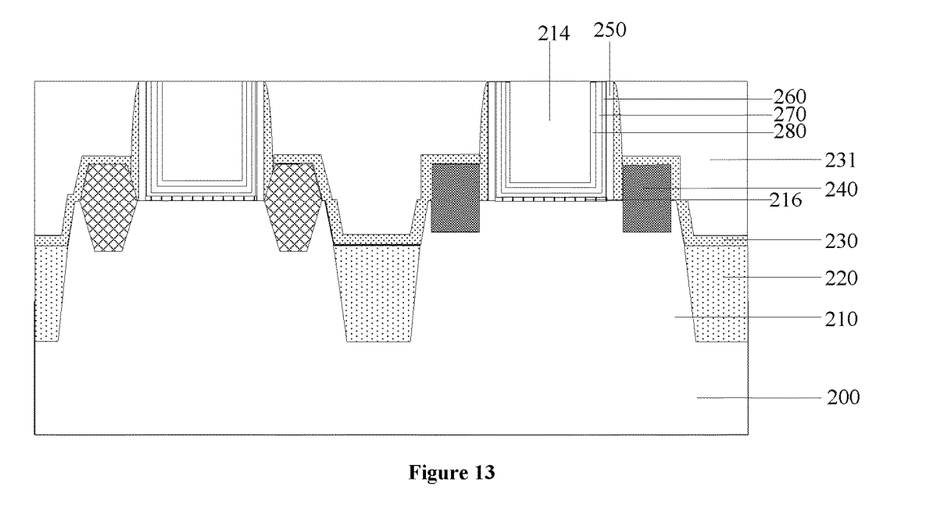

Referring to FIG. 13, in addition, the method for removing the gate dielectric layer 260 and the barrier layer 280 on the interlayer dielectric layer 231 may include using the organic coating layer 214 as a mask to remove the gate dielectric layer 260 and the barrier layer 280 on the interlayer dielectric layer 231. In one embodiment, the first working function layer 270 on the interlayer dielectric layer 231 may also be removed while removing the gate dielectric layer 260 and the barrier layer 280 on the interlayer dielectric layer 231.

In one embodiment, the method for removing the gate dielectric layer 260 and the barrier layer 280 on the interlayer dielectric layer 231 may include: etching the gate dielectric layer 260 and the barrier layer 280 by using the organic coating layer 214 as a mask to remove the gate dielectric layer 260 and the barrier layer 280 on the interlayer dielectric layer 231; and removing the first working function layer 270 on the interlayer dielectric layer 231 while removing the gate dielectric layer 260 and the barrier layer 280 on the interlayer dielectric layer 231.

In one embodiment, the process for removing the gate dielectric layer 260 on the interlayer dielectric layer 231 may include a dry etching process. Parameters of the dry etching process may include the following. Etching gas may include a mixed gas of HBr and He; HBr gas flow rate may be in a range of approximately 150 sccm-500 sccm; He gas flow rate may be in a range of approximately 100 sccm-400 sccm, pressure may be in a range of approximately 3 mtorr-10 mtorr, temperature may be in a range of approximately 50° C.-100° C., and power may be in a range of approximately 10 W-500 W.

In one embodiment, the process for removing the barrier layer 280 on the interlayer dielectric layer 231 may include a wet etching process. Parameters of the wet etching process may include the following. Etching temperature may be in a range of approximately 40° C.-90° C., ratio of the etching solutions of $NH_4OH:H_2O_2:H_2O$ may be approximately 1:2:50, or ratio of the etching solutions of $HCL:H_2O_2:H_2O$ may be approximately 1:1:50.

In another embodiment, the barrier layer may be removed by a dry etching process. Parameters of the dry etching process may include an etching gas including $SiH_4$, a $SiH_4$ gas flow rate in a range of approximately 30 sccm-3000 sccm, a temperature in a range of approximately 360° C.-520° C., and a pressure in a range of approximately 0.03 torr-10 torr.

Figure 14:
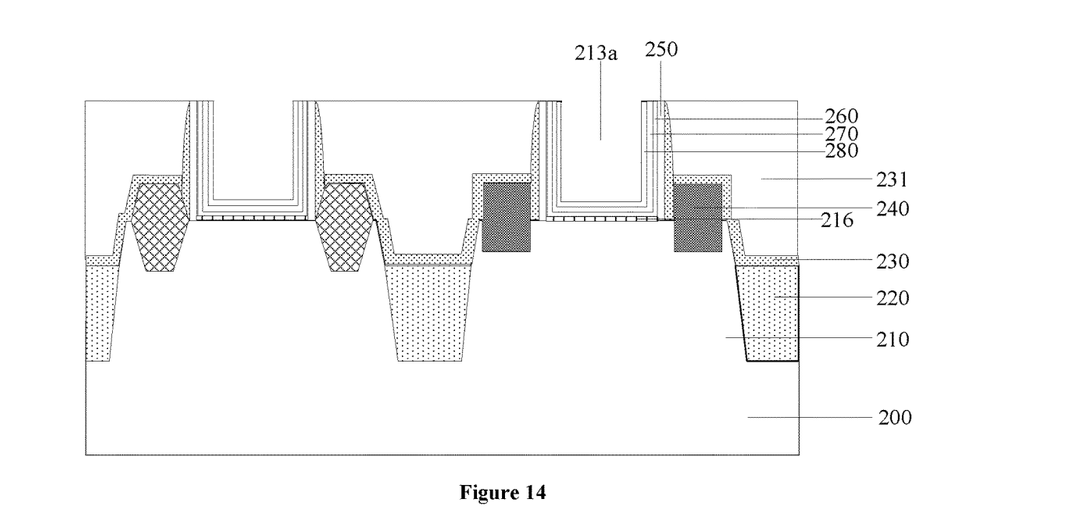

Referring to FIG. 14, further, the method for removing the gate dielectric layer 260 and the barrier layer 280 on the interlayer dielectric layer 231 may include removing the organic coating layer 214 (shown in FIG. 13). In one embodiment, the process for removing the organic coating layer 214 may include a dry etching process. Parameters of the dry etching process may include the following. Etching gas may include one or more of $CH_4$, $H_2$ and $N_2$, $CH_4$ gas flow rate may be in a range of approximately 10 sccm-100 sccm, $H_2$ gas flow rate may be in a range of approximately 100 sccm-800 sccm, $N_2$ gas flow rate may be in a range of approximately 30 sccm-500 sccm, pressure may be in a range of approximately 5 mtorr-150 mtorr, temperature may be in a range of approximately 30° C.-60° C., voltage may be in a range of approximately 80 V-200 V, power may be in a range of approximately 800 W-2200 W, and time may be in a range of approximately 50 seconds-500 seconds.

In another embodiment, the organic coating layer 214 may be removed by a dry etching process. In this process, parameters of the dry etching process may include the following. Etching gas may include one or more of $N_2$ and $H_2$, $N_2$ gas flow rate may be in a range of approximately 1000 sccm-8000 sccm, $H_2$ gas flow rate may be in a range of approximately 500 sccm-2000 sccm, temperature may be in a range of approximately 150° C.-350° C., and pressure may be in a range of approximately 500 mtorr-2000 mtorr.

In one embodiment, after removing the gate dielectric layer 260 and the barrier layer 280 on the interlayer dielectric layer 231, an annealing treatment may be performed. The annealing treatment may be used to repair the surface defects on the interface dielectric layer 216 in contact with the fins 210, and to densify the surface of the interface dielectric layer 216. In one embodiment, after removing the gate dielectric layer 260 and the barrier layer 280 from the interlayer dielectric layer 231, the annealing treatment may be performed. Because portions of the gate dielectric layer 260 and the barrier layer 280 that are on the interlayer dielectric layer 231 are removed before performing the annealing treatment, stress on the (remaining) barrier layer 280 generated by the annealing treatment may be reduced. Stress deformation on the interface dielectric layer 216 formed on the fins 210 may be reduced, thus the leakage issue caused by the stress deformation on the interface dielectric layer 216 may be prevented. Therefore, the leakage issue of the subsequently formed metal gate may be improved, and the electrical performance of the FinFET may be improved.

For example, the annealing treatment may include a spike annealing process, or a rapid annealing process, etc. Parameter of the spike annealing process may include a temperature in a range of approximately 900° C.-1050° C. Parameters of the rapid annealing process may include a temperature in a range of approximately 900° C.-1050° C., and time in a range of approximately 5 seconds-20 seconds.

Figure 15:
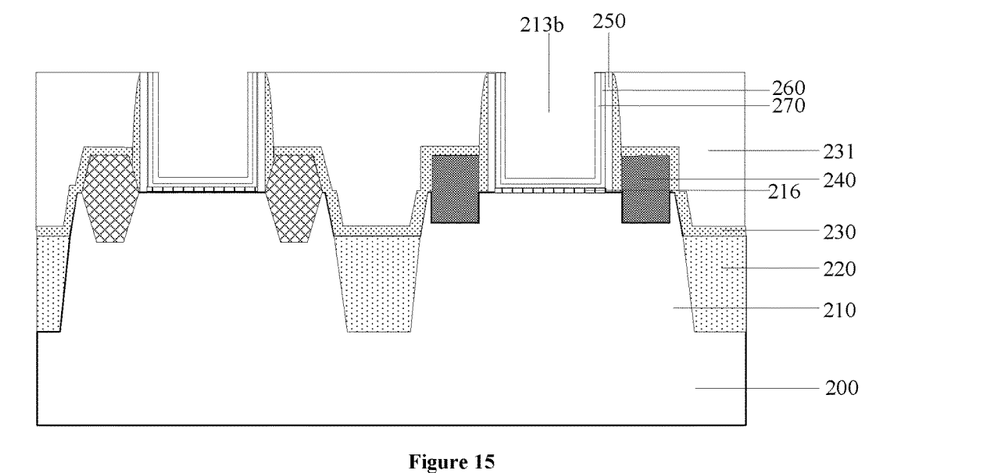

Returning to FIG. 17, after removing the gate dielectric layer and the barrier layer on the interlayer dielectric layer, a metal gate may be formed (S110). FIG. 15 illustrates a corresponding semiconductor structure.

Referring to FIG. 15, the barrier layer 280 in the opening 213a (shown in FIG. 14) may be removed, and a metal gate (not illustrated) may be formed in the opening 213b. In one embodiment, after removing the barrier layer 280 and before forming the metal gate (not illustrated), a second working function layer (not illustrated) may be formed in the opening 213b. The metal gate may be formed on the second working function layer.

In one embodiment, the second working function layer may be made of TiAl. In certain embodiments, the second working function layer may be made of TiCAl, or TiC, etc. The second working function layer may be used to adjust the threshold voltage of the FinFET. In one embodiment, the metal gate may be made of one or more of Ti, Ta, TiN, TaN, TiAl, TiAlN, Cu, Al, W, Ag and Au.

Figure 16:
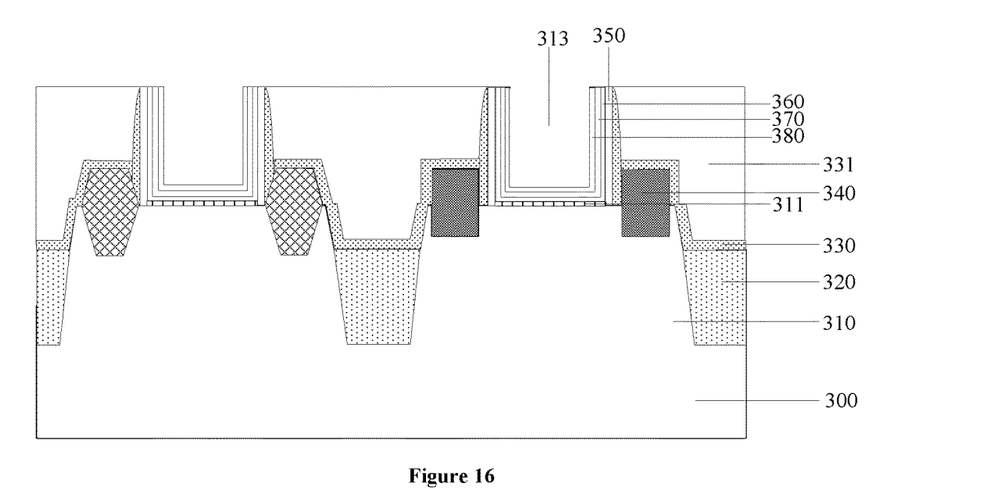
FIG. 16 illustrates a FinFET consistent with various disclosed embodiments of the present disclosure.

Correspondingly, a FinFET is also provided in the present disclosure. FIG. 16 illustrates a FinFET consistent with the disclosed embodiments.

Referring to FIG. 16, the FinFET may include a semiconductor substrate 300 having a plurality of discrete fins 310 on the semiconductor substrate 300. The FinFET may also include an interlayer dielectric layer 331 formed on the semiconductor substrate 300 and on the fins 310. In addition, the FinFET may include a gate dielectric layer 360 on the fins 310 and a barrier layer 380 on the gate dielectric layer 360. Moreover, the FinFET may include an opening 313 in the interlayer dielectric layer 331. The barrier layer 380 may surround the opening 313. Further, the FinFET may include source and drain doped regions 340 in the fins 310.

In one embodiment, the semiconductor substrate 300 may also include an isolation structure 320. The isolation structure 320 may cover portions of sidewalls of the fins 310, and the top of the isolation structure 320 may be lower than the top of the fins 310. The isolation structure 320 may be used to electrically isolate the adjacent fins 310.

In one embodiment, the semiconductor substrate 300 may be made of silicon (Si), germanium (Ge), germanium-silicon alloy (GeSi), silicon carbide (SiC), gallium arsenide (GaAs), or indium gallium (InGa), etc. In certain embodiments, the semiconductor substrate 300 may also include a silicon substrate formed on insulator (SOI), or a germanium substrate formed on insulator (GOI), etc. In one embodiment, the fins 310 may be made of silicon (Si), germanium (Ge), germanium-silicon alloy (GeSi), silicon carbide (SiC), gallium arsenide (GaAs), or indium gallium (InGa), etc. In one embodiment, the isolation structure 320 may be made of silicon oxide, silicon nitride, or silicon oxynitride, etc. In one embodiment, the semiconductor substrate 300 may be a silicon substrate, the fins 310 may be made of silicon, and the isolation structure 320 may be made of silicon oxide.

When the formed FinFET is an NMOS device, the source and drain doped regions 340 may be made of Si, or SiC. The source and drain doped regions 340 may be doped with N-type ions. For example, the N-type ions may include P, As, or Sb, etc. When the formed FinFET is a PMOS device, the source and drain doped regions 340 may be made of Si, or SiGe. The source and drain doped regions 340 may be doped with P-type ions. For example, the P-type ions may include B, Ga, or In, etc.

When the source and drain doped regions 340 are made of SiC, the source and drain doped regions 340 may provide a tensile stress on the channel region to increase the carrier mobility of the NMOS device. When the source and drain doped regions 340 are made of SiGe, the source and drain doped regions 340 may provide a compressive stress on the channel region to increase the carrier mobility of the PMOS device.

In one embodiment, an etching stop layer 330 may be formed on the isolation structure 320 and on the fins 310. In one embodiment, the etching stop layer 330 may be used to define an etching stop position of a contact hole when forming the contact hole of the FinFET. The etching stop layer 330 may be made of silicon nitride. A thickness of the etching stop layer 330 may be in a range of approximately 8 nm-30 nm.

The FinFET may also include an interface dielectric layer 311 formed on the fins 310, a gate dielectric layer 360 formed on the interface dielectric layer 311, a first working function layer 370 formed on the gate dielectric layer 360, and a barrier layer 380 formed on the first working function layer 370.

In one embodiment, the interface dielectric layer 311 may be made of silicon oxide. A thickness of the interface dielectric layer 311 may be in a range of approximately 5 Å-10 Å. The gate dielectric layer 360 may be made of hafnium oxide, or lanthanum hafnium oxide, etc. A thickness of the gate dielectric layer 360 may be in a range of approximately 10 Å-30 Å. The first working function layer 370 may be made of titanium nitride, or tantalum nitride, etc. A thickness of the first working function layer may be in a range of approximately 8 Å-50 Å. The barrier layer 380 may be made of silicon. A thickness of the barrier layer 380 may be in a range of approximately 20 Å-50 Å. The first working function layer 370 may be used to adjust the threshold voltage of the FinFET.

In one embodiment, the subsequent processes for forming the FinFET may also include an annealing treatment. Because the barrier layer 380 is formed in the opening 313, the high temperature in the annealing treatment may not cause a large stress on the barrier layer 380, thus the interface dielectric layer 311 on the fins 310 may not be deformed due to the stress in the barrier layer 380. Therefore, the leakage issue may be improved, and the electrical performance of the FinFET may be improved.

Because the barrier layer 380 is formed in the opening 313, the stress generated on the gate dielectric layer 360 and the barrier layer 380 during the annealing treatment may be easily released. As a result, the stress generated on the barrier layer 380 during the annealing treatment may be reduced, and the stress deformation generated on the interface dielectric layer 311 may be relieved, thus the leakage issue may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those skilled in the art. Any equivalent or modification thereof, without departing from the spirit and principle of the present disclosure, falls within the true scope of the present disclosure.

What is claimed is:

1. A method for fabricating a fin field effect transistor (FinFET), comprising:
   providing a plurality of discrete fins on a semiconductor substrate;
   forming a dummy gate across a length portion of the fins and covering portions of top and sidewall surfaces of the fins;
   forming an interlayer dielectric layer, covering the dummy gate and the fins;
   forming an opening in the interlayer dielectric layer by removing the dummy gate;
   forming a gate dielectric layer in the opening and on the interlayer dielectric layer;
   forming a barrier layer on the gate dielectric layer;
   removing a portion of the gate dielectric layer on the interlayer dielectric layer and a portion of the barrier layer on the interlayer dielectric layer;
   performing an annealing treatment after removing the portion of the gate dielectric layer on the interlayer dielectric layer and the portion of the barrier layer on the interlayer dielectric layer;
   removing a remaining portion of the barrier layer in the opening after performing the annealing treatment; and
   forming a metal gate in the opening.

2. The method according to claim 1, wherein removing the portion of the barrier layer on the interlayer dielectric layer includes:
   filling the opening with an organic coating layer;
   removing the portion of the barrier layer exposed by the organic coating layer; and
   removing the organic coating layer.

3. The method according to claim 2, wherein filling the opening with the organic coating layer includes:
   forming an organic coating film to cover the barrier layer; and
   back-etching the organic coating film over the interlayer dielectric layer to form the organic coating layer in the opening.

4. The method according to claim 2, wherein:
   removing the portion of the barrier layer exposed by the organic coating layer includes a dry etching process using parameters including:
   an etching gas including $SiH_4$,
   a $SiH_4$ gas flow rate in a range of approximately 30 sccm 3000 sccm,
   a temperature in a range of approximately 360° C.-520° C., and
   a pressure in a range of approximately 0.03 torr-10 torr.

5. The method according to claim 2, wherein:
   removing the organic coating layer includes a dry etching process using parameters including:
   etching gases including one or more of $N_2$ and $H_2$,
   a $N_2$ gas flow rate in a range of approximately 1000 sccm-8000 sccm,
   a $H_2$ gas flow rate in a range of approximately 500 sccm-2000 sccm,
   a temperature in a range of approximately 150° C.-350° C., and
   a pressure in a range of approximately 500 mtorr 2000 mtorr.

6. The method according to claim 1, wherein:
   forming the gate dielectric layer includes an atomic layer deposition process using parameters including:
   a precursor including Si,
   a temperature in a range of approximately 80° C.-300° C.,
   a pressure in a range of approximately 5 torr-20 torr, and
   a repeated deposition for approximately 5 times-50 times.

7. The method according to claim 1, further including:
   forming an interface dielectric layer on a bottom of the opening, before forming the gate dielectric layer, such that the interface dielectric layer is formed between the semiconductor substrate and the gate dielectric layer.

8. The method according to claim 7, wherein:
   the interface dielectric layer is formed by an oxidation process using parameters including:
   an introduced gas including $H_2O_2$ gas, and
   a reaction time in a range of approximately 5 seconds-500 seconds at a temperature in a range of approximately 10° C.-100° C., or
   introduced gases including $H_2$ and $O_2$,
   a $H_2$ gas flow rate in a range of approximately 0.2 slm-10 slm,
   an $O_2$ gas flow rate in a range of approximately 10 slm-100 slm,
   a reaction temperature in a range of 800° C.-1100° C.,
   a pressure in a range of approximately 4 torr-100 torr, and
   a reaction time in a range of approximately 5 seconds-30 seconds.

9. The method according to claim 7, wherein:
   the interface dielectric layer is made of a material including one of silicon oxide and silicon oxynitride; and
   a thickness of the interface dielectric layer is in a range of approximately 5 Å-10 Å.

10. The method according to claim 1, wherein:
    a thickness of the barrier layer is in a range of approximately 20 Å-50 Å.

11. The method according to claim 1, wherein:
    the annealing treatment includes a spike annealing process or a rapid annealing process, wherein:
    the spike annealing process is performed at a temperature in a range of approximately 900° C.-1050° C., and the rapid annealing process is performed at a temperature in a range of approximately 900° C.-1050° C. for an annealing time in a range of approximately 5 seconds-20 seconds.

12. The method according to claim 1, further including:
forming a first working function layer on the gate dielectric layer after forming the gate dielectric layer and before forming the barrier layer; and
removing the first working function layer on the interlayer dielectric layer, while removing the gate dielectric layer and the barrier layer from the interlayer dielectric layer.

13. The method according to claim 12, wherein:
the first working function layer is made of a material including one of titanium nitride and tantalum nitride.

14. The method according to claim 1, wherein:
the gate dielectric layer is made of a material including one of hafnium oxide and lanthanum hafnium oxide.

15. The method according to claim 1, wherein:
the barrier layer is made of a material including silicon.

16. The method according to claim 1, further including:
forming a second working function layer in the opening after removing the barrier layer in the opening and before forming the metal gate, and
forming the metal gate on the second working function layer.

17. The method according to claim 1, further including after forming the dummy gate and before forming the interlayer dielectric layer:
forming a sidewall spacer on sidewalls of the dummy gate, and
forming source and drain doped regions in the fins on both sides of the dummy gate and the sidewall spacer.

18. A FinFET, comprising:
a semiconductor substrate;
a plurality of discrete fins on the semiconductor substrate;
an interlayer dielectric layer on the semiconductor substrate and on the fins, wherein the interlayer dielectric layer contains an opening;
a gate dielectric layer covering sidewalls and a bottom of the opening;
a barrier layer on the gate dielectric layer, wherein the barrier layer is made of a material including silicon;
a metal gate on the barrier layer; and
source and drain doped regions in the fins.

19. The FinFET according to claim 18, further including:
an interface dielectric layer on the fins;
the gate dielectric layer on the interface dielectric layer;
a first working function layer on the gate dielectric layer; and
the barrier layer on the first working function layer.

20. The FinFET according to claim 18, wherein:
a thickness of the barrier layer is in a range of approximately 20 Å-50 Å.

* * * * *